United States Patent
J. et al.

(10) Patent No.: US 9,455,721 B2
(45) Date of Patent: Sep. 27, 2016

(54) FLL OSCILLATOR/CLOCK WITH AN FLL CONTROL LOOP INCLUDING A SWITCHED CAPACITOR RESISTIVE DIVIDER

(71) Applicant: Texas Instruments Incorporated, Dallas, TX (US)

(72) Inventors: Divyasree J., Bangalore (IN); Anant Shankar Kamath, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/588,293

(22) Filed: Dec. 31, 2014

(65) Prior Publication Data

US 2016/0105187 A1    Apr. 14, 2016

Related U.S. Application Data

(60) Provisional application No. 62/062,095, filed on Oct. 9, 2014.

(51) Int. Cl.

| | |
|---|---|
| H03L 7/06 | (2006.01) |
| H03K 3/03 | (2006.01) |
| H03K 4/06 | (2006.01) |
| H03L 7/00 | (2006.01) |

(52) U.S. Cl.
CPC .............. *H03L 7/06* (2013.01); *H03K 3/0315* (2013.01); *H03K 4/06* (2013.01); *H03L 7/00* (2013.01)

(58) Field of Classification Search
CPC .................................. H03J 7/042; H03J 7/08
USPC ................................................. 331/36 C, 15
See application file for complete search history.

(56) References Cited

U.S. PATENT DOCUMENTS

| | | | |
|---|---|---|---|
| 6,166,606 A | 12/2000 | Tsyrganovich | |
| 7,002,415 B2 | 2/2006 | Tsyrganovich | |
| 2004/0145422 A1 | 7/2004 | Sanduleanu | |
| 2006/0203937 A1 | 9/2006 | Burgio | |
| 2014/0002197 A1* | 1/2014 | Patasani | H03L 1/00 331/8 |
| 2015/0061736 A1* | 3/2015 | Mai | H03L 7/0802 327/156 |

OTHER PUBLICATIONS

PCT Search Report for Application No. PCT/US 2015/054864, dated Mar. 31, 2016.

* cited by examiner

*Primary Examiner* — Joseph Chang
(74) *Attorney, Agent, or Firm* — Andrew Viger; Frank D. Cimino

(57) ABSTRACT

An FLL (frequency locked loop) oscillator/clock generator includes a free-running oscillator (such as a ring oscillator), and generates an FLL_clk with an FLL-controlled frequency $f_{OSC}$. The FLL control loop includes a switched capacitor resistor divider that converts $f_{OSC}$ to a resistance, generating an FLL feedback voltage Vfosc used to generate a loop control signal OSC_cntrl input to the oscillator. In response, the oscillator frequency locks FLL_clk to fosc. In an example implementation, the FLL oscillator/clock operates with spread spectrum clocking (SSC) that provides triangular SSC modulation based on a truncated RC transition voltage generated as a negative feedback to an RC relaxation oscillator, with truncation based on switched tripping threshold voltages generated a positive feedback to the RC relaxation oscillator.

14 Claims, 4 Drawing Sheets

FLL OSCILLATOR/CLOCK WITH AN FLL CONTROL LOOP INCLUDING A SWITCHED CAPACITOR RESISTIVE DIVIDER

CROSS-REFERENCE TO RELATED APPLICATIONS

Priority is claimed under USC §119(e) to U.S. Provisional Application 62/062,095, filed 9 Oct. 2014.

BACKGROUND

1. Technical Field

This Patent Disclosure relates generally to free running oscillators used with frequency locked control loops.

2. Related Art

Free running oscillators, in comparison to PLLs (phase locked loops), avoid the requirement for a PLL reference clock, and require significantly less area and power, even when implemented as an FLL (frequency locked loop) oscillator/clock. FLLs (incorporating free-running oscillators) are an acceptable alternative to a PLL in systems with sufficient tolerance for phase noise and frequency variation.

One application is a high frequency (300-3000 MHz) oscillator as the modulating clock in an OOK (on-off keying) based transmission and envelope detection receiving system. Since the receiver is an envelope detector, phase noise of the modulating clock is less important. Also, a certain variation in frequency is acceptable, since primarily, the receiver/detector responds to amplitude and not frequency.

Another application is a clocked power converter, where phase noise is not critical, and some error in frequency is acceptable.

Use of high frequency clocking in signal chain applications ordinarily requires taking into account EMI (electromagnetic interference) design considerations. Spread spectrum techniques can be used to spread the EMI energy over a certain frequency band, taking into account frequency deviation as a percentage of center frequency, and spread spectrum modulation frequency.

BRIEF SUMMARY

This Brief Summary is provided as a general introduction to the Disclosure provided by the Detailed Description and Figures, summarizing some aspects and features of the Disclosure. It is not a complete overview of the Disclosure, and should not be interpreted as identifying key elements or features of the invention, or otherwise characterizing or delimiting the scope of the invention disclosed in this Patent Document.

The Disclosure is directed generally to the problem of generating a clock with a free running oscillator based on a frequency locked loop (FLL) to avoid using a phase locked loop. The Disclosure describes apparatus and methods for an FLL oscillator/clock with an FLL control loop including a switched capacitor resistive divider.

According to aspects of the Disclosure, the methodology generating a clock using an FLL (frequency locked loop) oscillator circuit includes: (a) generating an oscillator signal FLL_clk with a frequency $f_{OSC}$ based on an oscillator control signal; (b) generating the oscillator control signal based on a frequency control signal representative of the frequency of the FLL_clk output of the FLL oscillator; and (c) generating the frequency control signal based on the frequency of the FLL_clk, using a switched-capacitor resistor-divider that includes a resistor and a switched capacitor coupled at an R-divider node by (1) switching the switching capacitor in response the FLL_clk to convert the frequency fosc to a switched-cap resistance; and (2) outputting the frequency control signal from the R-divider node based on voltage division provided by the resistor and the switched-cap resistance.

In described examples, the methodology includes: (a) generating a spread spectrum control signal corresponding to a spread spectrum modulation function; (b) modulating the frequency control signal with the spread spectrum control signal; (c) generating an FLL control signal based the frequency control signal with spread spectrum modulation; and (d) generating the oscillator control signal with spread spectrum modulation based on the FLL control signal. As a result, the FLL oscillator generates FLL_clk with spread spectrum modulation. In described examples, the spread spectrum control signal is generated with an RC relaxation oscillator including a comparator with inverting and noninverting inputs and an output, including: (a) providing a negative feedback RC transition voltage to the inverting input of the comparator, based on an RC circuit characterized by an RC time constant; (b) generating a tripping threshold voltage by switching between a $V_{TH}$ upper tripping threshold voltage, and a $V_{TL}$ lower tripping threshold voltage, with switching controlled by the comparator output; (c) providing the tripping threshold voltage as a positive feedback tripping threshold voltage to the noninverting input of the comparator, such that the negative feedback RC transition voltage is truncated (corresponding to the $V_{TH}$ and $V_{TL}$ tripping threshold voltages), and substantially triangular; and (d) generating the spread spectrum control signal based on the substantially triangular, truncated RC transition voltage.

Other aspects and features of the invention claimed in this Patent Document will be apparent to those skilled in the art from the following Disclosure.

DESCRIPTION

Figure 1:
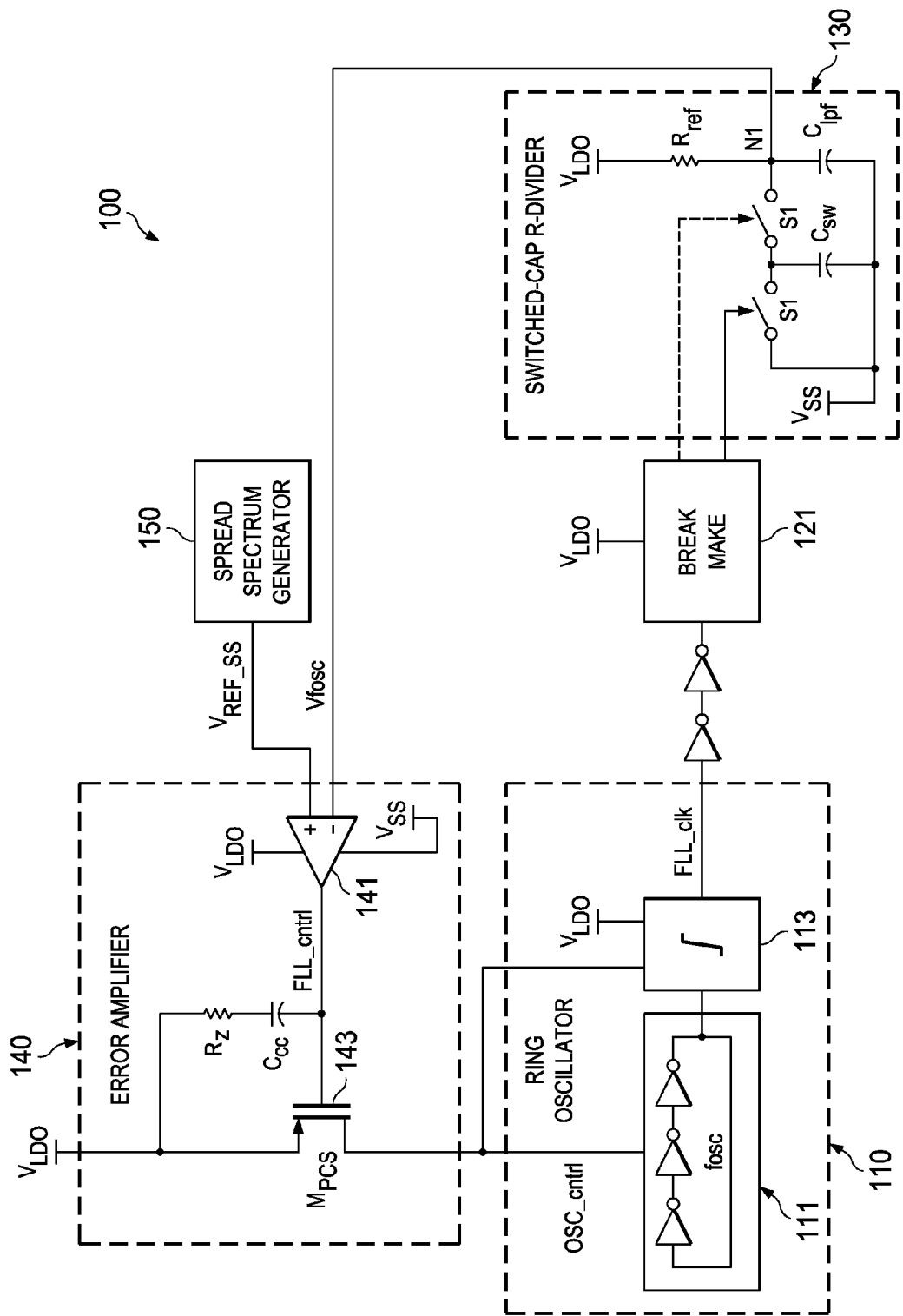
FIG. 1 illustrates an example embodiment of an FLL oscillator/clock generator, including a free-running FLL oscillator, operating with an FLL control loop that includes a switched-cap resistor divider and a feedback error amplifier, and including an SSC (spread spectrum clocking) generator interfaced to the FLL loop.

This Description and the Figures constitute a Disclosure of example embodiments and applications that illustrate various features and advantages of an FLL (frequency locked loop) oscillator/clock generator, including a control loop with a switched capacitor resistive divider.

In brief overview, example embodiments of the FLL (frequency locked loop) oscillator/clock generator include a free-running oscillator (such as a ring oscillator), and generates an FLL_clk with an FLL-controlled frequency $f_{OSC}$. The FLL control loop includes a switched capacitor resistor divider that converts $f_{OSC}$ to a resistance, generating an FLL feedback voltage Vfosc used to generate a loop control signal OSC_cntrl input to the oscillator. In response, the oscillator frequency locks FLL_clk to fosc. In an example implementation, the FLL oscillator/clock operates with spread spectrum clocking (SSC) that provides triangular SSC modulation based on a truncated RC time constant.

In an example application, the FLL oscillator/clock can be used in a digital isolator, providing a modulating clock for OOK-based transmission with envelope-detection reception. An example clock frequency is 500 MHz (supporting, for example, 100 Mbps operation). SSC can be used to reduce EMI, including EMI from the transmission of unbalanced common mode currents across the isolation barrier.

In example embodiments, an FLL (frequency locked loop) oscillator circuit is suitable for use as a clock generator. The FLL clock/oscillator includes: (a) a frequency locked loop (FLL) oscillator generating an oscillator signal FLL_clk with a frequency $f_{OSC}$ based on an oscillator control signal; and (b) an FLL control loop configured to generate the oscillator control signal based on the frequency of the FLL_clk output of the FLL oscillator. The FLL control loop includes: (a) a switched-capacitor resistor-divider circuit configured to provide the frequency control signal to the FLL control circuit, based on the frequency of the FLL_clk; and (b) an FLL control circuit configured to provide the oscillator control signal to the FLL oscillator, based on the frequency control signal. The switched capacitor resistor-divider includes: (a) a resistor coupled at an R-divider node to a switched capacitor; and (b) the switched capacitor is configured to convert the frequency $f_{OSC}$ of FLL_clk to a resistance such that the resistor and the switched capacitor operate as resistor divider that outputs the frequency control signal at the R-divider node.

In example embodiments, the FLL oscillator further includes a spread spectrum clocking (SSC) generator configured to generate a spread spectrum control signal corresponding to a spread spectrum modulation function. For this embodiment, the FLL control circuit includes: (a) an amplifier circuit receiving the spread spectrum control signal from the SSC generator at a noninverting input, and the frequency control signal from the switched-capacitor resistor-divider at an inverting input, and outputting an FLL control signal corresponding to the frequency control signal with spread spectrum modulation; and (b) the FLL control circuit providing the oscillator control signal with spread spectrum modulation based on the FLL control signal, such that the FLL oscillator generates FLL_clk with spread spectrum modulation.

In example embodiments, the SSC generator includes: (a) an RC relaxation oscillator circuit, including a comparator with inverting and noninverting inputs and an output; and (b) a tripping threshold setting circuit. The RC relaxation oscillator includes: (a) an RC circuit characterized by an RC time constant providing a negative feedback RC transition voltage to the inverting input; and (b) the tripping threshold circuit providing a positive feedback tripping threshold voltage to the noninverting input, and configured to switch between a $V_{TH}$ upper tripping threshold voltage, and a $V_{TL}$ lower tripping threshold voltage, with switching controlled by the comparator output, such that the negative feedback RC transition voltage is truncated (corresponding to the $V_{TH}$ and $V_{TL}$ tripping threshold voltages), and substantially triangular. As a result, the SSC generator outputs as the spread spectrum control signal the substantially triangular, truncated RC transition voltage.

FIG. 1 illustrates an example embodiment of the FLL clock generator 100. FLL clock generator 100 includes a free-running FLL oscillator 110, operating with an FLL control loop that includes a switched-capacitor resistive-divider 130 and a feedback error amplifier 140. For the example implementation, SSC control is provided by an SSC generator 150.

FLL clock generator 100 outputs from FLL oscillator 110 an FLL_clk with a frequency fosc controlled by the FLL control loop. Switched-cap R-divider 130 converts fosc to an FLL control voltage Vfosc that is input to error amplifier 140, which also receives an SSC control voltage $V_{REF\_SS}$ from SSC generator 150.

An LDO (low drop-out) regulator provides a clean supply VLDO for each of the FLL clock generator blocks: FLL oscillator 110, switched-cap R-divider 130 and error amplifier 140, as well as SSC generator 150.

FLL oscillator 110 is implemented with a current-controlled ring oscillator 111, generating the FLL_clk with frequency $f_{OSC}$. The FLL_clk output of ring oscillator 111 is level shifted 113 to provide the FLL_clk with rail to rail swings (for example, for CMOS levels). FLL_clk (after level shifting) is passed through a break-before-make timing generator 121 for input to switched-cap R-divider 130.

Switched-cap R-divider 130 includes a resistor Rref and a switched capacitor Csw that form a resistor divider Rref/Csw, with the resistor divider output available at node N1. FLL_clk with frequency fosc controls the switched-capacitor Csw, effectively converting frequency fosc to a resistance. Switched-cap R-divider 140 (resistor divider Rref/Csw) converts fosc to an FLL feedback voltage Vfosc at the output N1. A capacitor $C_{lpf}$ can be included to reduce ripple.

The FLL feedback voltage Vfosc from switched-cap R-divider 130 is input to error amplifier 140.

Error amplifier 140 includes an amplifier 141 providing gate drive to a current control Mpcs (PMOS) 143, which is source connected to the VLDO supply. Amplifier 141 receives the FLL control voltage Vfosc (inverting input), and an SSC modulation voltage $V_{REF\_SS}$ (noninverting input) from SSC Generator 150, and outputs an FLL control voltage FLL_cntrl that controls current through Mpcs 143, which is output as a oscillator control current OSC_cntrl.

The OSC_cntrl current from error amplifier 140 is input to ring oscillator 111 in FLL oscillator 110, closing the FLL control loop.

FLL oscillator 110 converts the OSC_cntrl current to an OSC_cntrl voltage for ring oscillator 111. In response, ring oscillator 111 outputs the FLL_clk (level shifted) at the desired fosc based on OSC_cntrl generated by the FLL control loop.

The FLL control voltage Vfosc from switched-cap R-divider provides FLL/fosc feedback control for the FLL_clk output of ring oscillator 111. That is, the FLL control loop could be designed to provide FLL/fosc feedback control based solely on the FLL control voltage Vfosc provided by the switched-cap R-divider, and input to error amplifier 140. In this implementation, the FLL_cntrl voltage used to drive current control Mpcs 143 would correspond to Vfosc, and the OSC_cntrl current from Mpcs 143 would lock FLL_clk to fosc.

For the example embodiment, FLL_clk is SSC modulated. Amplifier 111 combines the FLL control voltage Vfosc from switched-cap R-divider 130 with the SSC modulation voltage $V_{REF\_SS}$ from SSC generator 150. Negative feedback that drives Vfosc to $V_{REF\_SS}$ (steady state), effectively SSC modulating the FLL_cntrl output of amplifier 141.

As a result, the OSC_cntrl current used to control ring oscillator 111 is SSC modulated, which SSC modulates the FLL_clk output form the ring oscillator (SSC modulating fosc).

The FLL closed loop negative feedback generates an FLL_clk that is frequency locked to the desired fosc based on Vfosc from the from switched-cap R-divider 130, and SSC modulated based on $V_{REF\_SS}$ from SSC generator 150. The value of the switched-capacitor resistor is ($1/\text{fosc}*C_{SW}$), so that the feedback loop establishes the following relations:

$$V_{LDO}/(1+f_{osc}R_{ref}C_{SW})=V_{focs} \sim V_{REF\_SS}$$

$$f_{osc}=(V_{LDO}-V_{REF\_SS})/(R_{ref}C_{SW}V_{focs}) \sim V_{REF\_SS}$$

That is, without SSC modulation, the FLL control loop would control fosc based on the FLL feedback voltage Vfosc. With SSC modulation, the negative feedback at amplifier 111 operates to lock Vfosc to $V_{REF\_SS}$, SSC modulating FLL_clk (with a fundamental frequency fosc, driven by the Vfosc loop).

The FLL feedback voltage $V_{fosc}$ provided by the switched capacitor resistor divider RrefCsw, is referenced to (proportional to) $V_{LDO}$. As a result, oscillator frequency $f_{OSC}$ depends only on the $R_{ref}C_{SW}$ time constant. Any PVT variation in the LDO voltage $V_{LDO}$ is cancelled out and does not affect the oscillator frequency $f_{OSC}$.

Controlled poly resistors are recommended. At the same time $C_{SW}$ can be an MOS oxide based capacitor, such as a poly-nwell capacitor, which has a well-controlled process variation. For example, an oscillator frequency $f_{OSC}$ varying within +/−13% across PVT can be built using a design based on the example embodiment. Using trim for process variation in the resistors and capacitors can further improve oscillator variation to just temperature variation (for example, +/−3.5%).

Figure 2A:
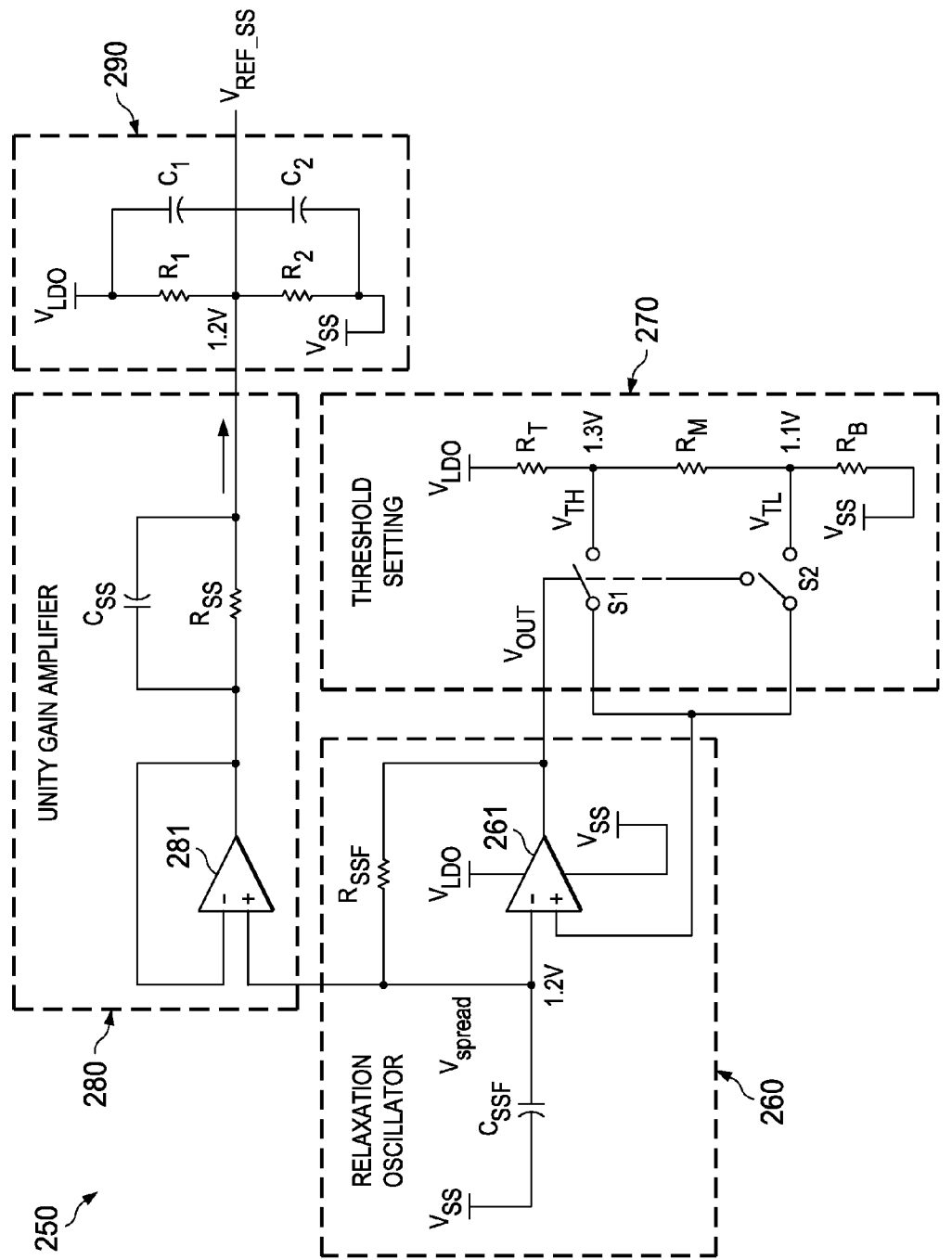
FIGS. 2A, 2B, 2C, 2D illustrates an example embodiment of an SSC (spread spectrum clocking) generator that can be used with the example FLL clock generator of FIG. 1, to provide triangular SSC modulation based on a truncated RC time constant: (2A) illustrates an example SSC generator including a relaxation oscillator with a switched threshold (trip) setting circuit; (2B) provides example waveforms; and (2C) and (2D) aid in illustrating triangular SSC modulation based on RC truncation.
Figure 2B:
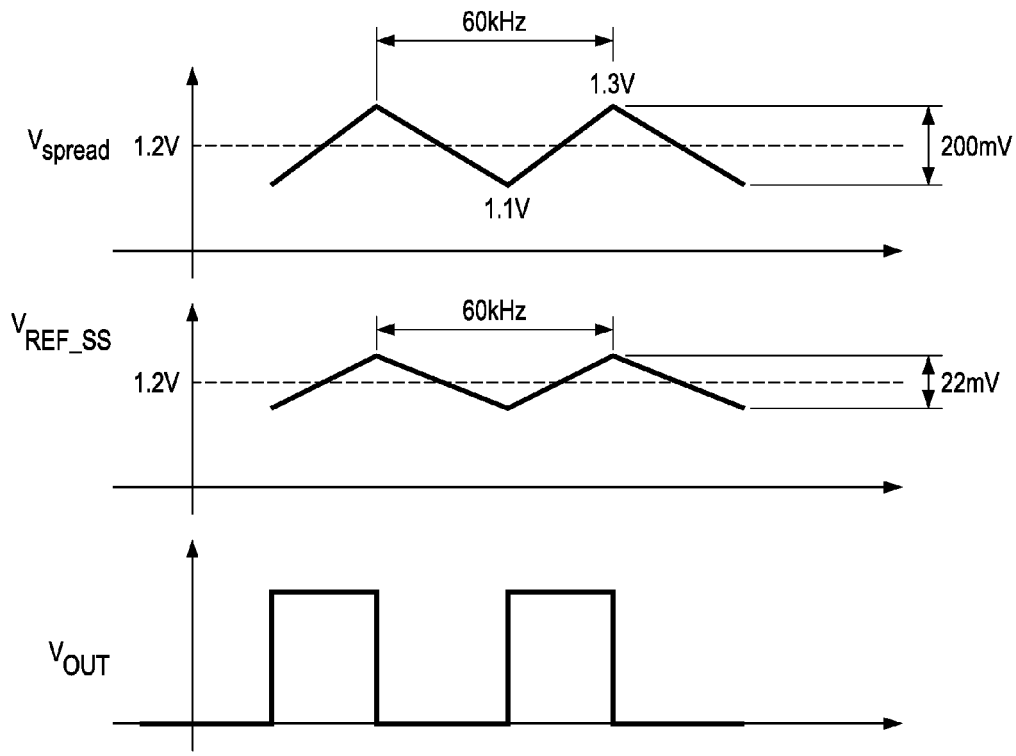

FIGS. 2A and 2B illustrates an example embodiment of an SSC (spread spectrum clocking) generator 250 that can be used with the example FLL clock generator in FIG. 1, i.e., SSC generator 150. Controlled spread spectrum clocking can be achieved with a substantially fixed frequency deviation as a percentage of center frequency, and a substantially fixed SSC modulation frequency. SSC generator 250 is supplied by $V_{LDO}$.

Figure 2D:
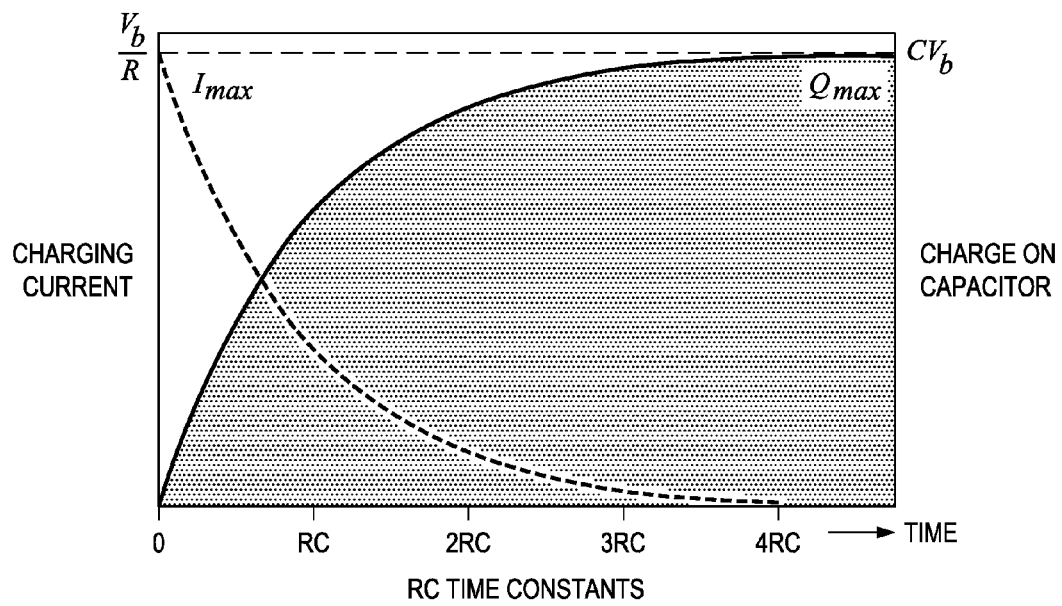
Figure 2C:
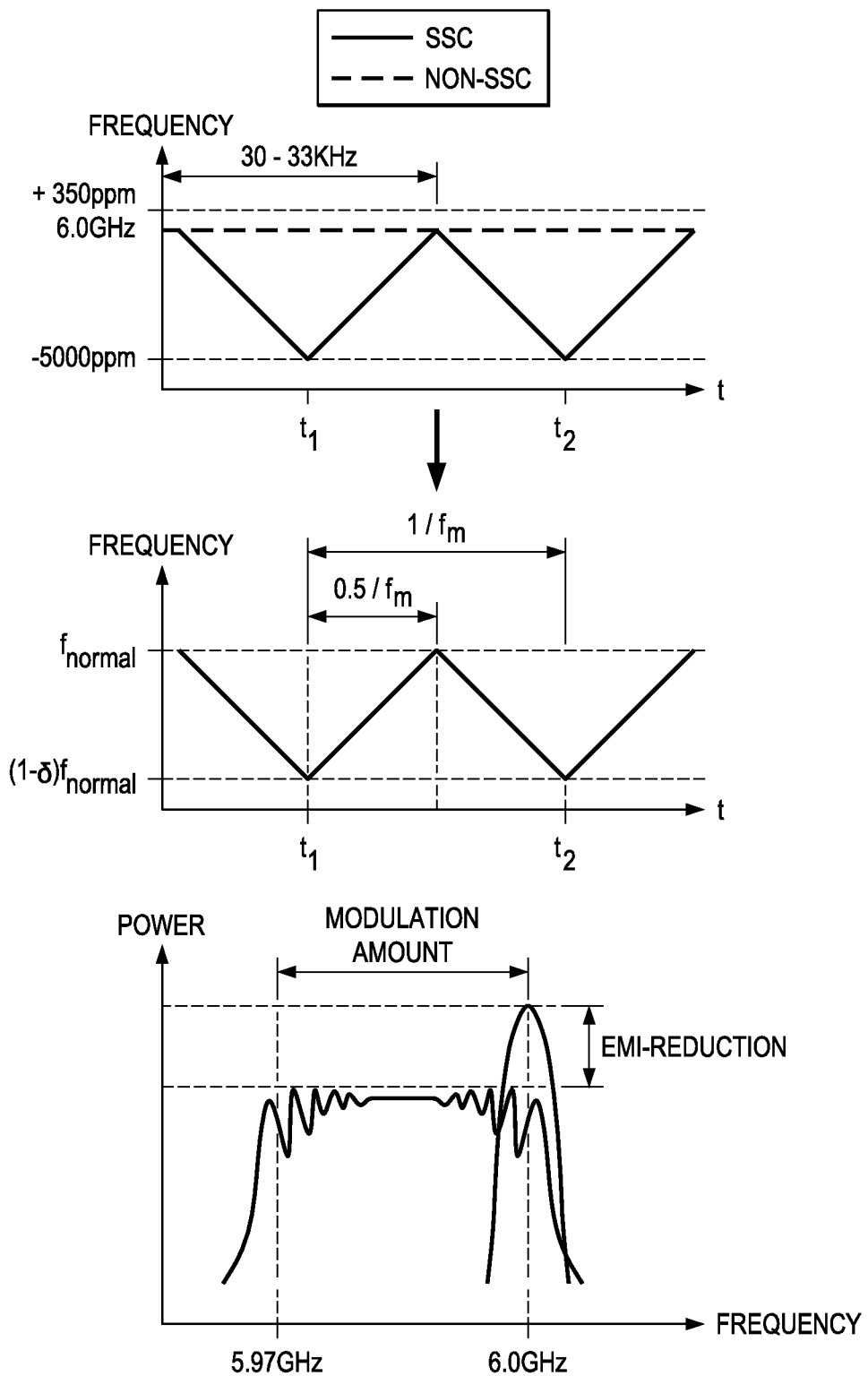

SSC generator 250 provides triangular SSC modulation based on truncated RC time constant. As illustrated in FIG. 2C, for an efficient spread spectrum (close to uniform emissions spread in the spread spectrum band), SSC is achieved with a near triangular spread spectrum frequency profile.

SSC generator 250 includes an RC relaxation oscillator 260, and switched threshold (trip point) setting circuit 270. Relaxation oscillator 260 includes a comparator 261, with negative feedback (inverting input) through $R_{SSF}/C_{SSF}$, and positive feedback (noninverting input) from the threshold setting circuit 270. Threshold setting circuit 270 provides a switched threshold/trip point.

Relaxation oscillator 260 generates a spread spectrum voltage Vspread corresponding to the $R_{SSF}/C_{SSF}$ feedback voltage. Vspread is characterized by the $R_{SSF}/C_{SSF}$ rise/fall transient, based on the $R_{SSF}/C_{SSF}$ time constant.

Vspread is buffered by a unity gain amplifier 270, and applied to a resistor-divider reference circuit 290, which outputs the SSC modulation voltage $V_{REF\_SS}$.

Referring to 2A and the associated waveforms in FIG. 2B, threshold setting circuit 280 includes a switched resistor divider/ladder $R_T \| R_M \| R_B$ that switches between $V_{TH}$ (for example, 1.3V) and $V_{TL}$ (for example, 1.1V) centered about a Vspread center voltage (for example, 1.2V). $V_{TH}$ and $V_{TL}$ can be chosen so that $V_{TH}-V_{TL} \ll V_{LDO}$. This implementation ensures that, while $V_{OUT}$ from comparator 261, which drives the threshold setting switches S1S2, switches rail-to-rail from 0 to $V_{LDO}$, the common mode voltage swing for $V_{SPREAD}$ is near triangular (for example, 200 mV centered about a $V_{SPREAD}$ center voltage of 1.2V).

Switching the noninverting input between the switched $V_{TH}/V_{TL}$ thresholds/trip points effectively truncates the $R_{SSF}/C_{SSF}$ rise/fall transient, so that Vspread is generated based on the initial, substantially linear, part of the RC transient. As illustrated in FIG. 2D, in the initial part of the transient (beginning of the first RC time constant), the resulting Vspread voltage is substantially linear, providing a substantially triangular SSC modulation function.

The values of $R_{SSF}$ and $C_{SSF}$ can be chosen so that the relaxation oscillator oscillates at, for example, 60 kHz. In this implementation, the swing at $V_{SPREAD}$ is 200 mV pk-pk and $V_{LDO}$ is 1.85V.

The spread spectrum voltage $V_{SPREAD}$ is buffered by unity gain amplifier 271, and then input to resistor-divider reference 290 through a large resistor $R_{SS}$. $R_{SS}$ along with the resistor divider $R_1 \| R_2$ attenuates the triangular Vspread voltage applied to reference circuit 290, and hence provides a relatively small SSC percentage (for example, +/−2.5%). $V_{REF\_SS}$ is used as the SSC voltage to the closed loop oscillator described earlier.

The common mode voltage of $V_{SPREAD}$ ($V_{TH}+V_{TL}$)/2 (for example, 1.2V) can be chosen to match the desired dc voltage of $V_{REF\_SS}$, so that under dc conditions, i.e. at the center point of the spread spectrum waveform, no current flows through $R_{SS}$. This design makes the SSC generator modular, so that spread spectrum clocking can be configured independent of the main FLL clock generator, and the FLL control loop.

SSC percentage can be controlled by the value of $R_{SS}$. $C_1$, $C_2$ and $C_{SS}$ caps are used to broad band the reference resistor divider R1∥R2, and to prevent filtering of the spread spectrum waveform input to the FLL control loop. Since $V_{TH}$ and $V_{TL}$ are proportional to $V_{LDO}$, the signal $V_{REF\_SS}$ also remains proportional to $V_{LDO}$, even after the addition of the spread spectrum voltage Vspread. As a result, variations in $V_{LDO}$ are substantially cancelled and do not affect the oscillator frequency $f_{OSC}$.

FIGS. 2A and 2B include specific design example voltages that aid in describing the example embodiment, and should not be construed in limiting the scope or content of the Disclosure.

Advantages of the disclosed embodiment of an FLL clock generator include reduced frequency variation across PVT (process voltage temperature) without requiring external components (such as resistors/crystals). Reducing frequency variation across PVT enables a narrower receiver bandwidth, resulting in better rejection of out of band noise.

Advantages of the disclosed embodiment of a spread spectrum clocking generator include a high degree of spread spectrum control, and simple integration into an FLL control loop (at a loop reference node). Spread spectrum is achieved as a fixed percentage of main loop frequency. Tight control of spread-spectrum enables the transmitter/receiver to be designed with optimum frequency variation.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. An FLL (frequency locked loop) oscillator circuit suitable for use as a clock generator, comprising
   a frequency locked loop (FLL) oscillator generating an oscillator signal FLL_clk with a frequency $f_{OSC}$ based on an oscillator control signal, the FLL_clk generated with spread spectrum modulation;
   an FLL control loop to generate the oscillator control signal based on the frequency $f_{OSC}$ of the FLL_clk output of the FLL oscillator, including
      a switched-capacitor resistor-divider circuit to provide a frequency control signal, based on the frequency of the FLL_clk,
      a spread spectrum clocking (SSC) generator to generate a spread spectrum control signal corresponding to a spread spectrum modulation function, and
      an FLL control circuit to provide the oscillator control signal to the FLL oscillator, based on the frequency control signal, and the spread spectrum control signal;
   the switched capacitor resistor-divider including:
      a resistor coupled at an R-divider node to a switched capacitor;
      the switched capacitor to convert the frequency $f_{OSC}$ of FLL_clk to a resistance;
      such that the resistor and the switched capacitor operate as resistor divider that outputs the frequency control signal at the R-divider node; and
   the FLL control circuit including:
      an amplifier circuit receiving the spread spectrum control signal from the SSC generator at a noninverting input, and the frequency control signal from the switched-capacitor resistor-divider at an inverting input, and outputting an FLL control signal corresponding to the frequency control signal with spread spectrum modulation;
      the FLL control circuit providing the oscillator control signal with spread spectrum modulation based on the FLL control signal.

2. The circuit of claim 1, wherein the FLL oscillator comprises a ring oscillator, responsive to the oscillator control signal to adjust oscillation frequency.

3. The circuit of claim 1, wherein the FLL control circuit further comprises a current control transistor controlled by the FLL control signal, and outputting the oscillator control signal as a controlled current.

4. The circuit of claim 1:
   wherein the SSC generator comprises:
      an RC relaxation oscillator circuit, including a comparator with inverting and noninverting inputs and an output; and
      a tripping threshold setting circuit;
      the RC relaxation oscillator including
         an RC circuit characterized by an RC time constant providing a negative feedback RC transition voltage to the inverting input;
         the tripping threshold circuit providing a positive feedback tripping threshold voltage to the noninverting input, and configured to switch between a $V_{TH}$ upper tripping threshold voltage, and a $V_{TL}$ lower tripping threshold voltage, with switching controlled by the comparator output;

such that the negative feedback RC transition voltage is truncated (corresponding to the $V_{TH}$ and $V_{TL}$ tripping threshold voltages), and substantially triangular;
   wherein the SSC generator outputs as the spread spectrum control signal the substantially triangular, truncated RC transition voltage.

5. The circuit of claim 1, further comprising a low dropout voltage regulator (LDO) providing a VLDO supply voltage for the FLL oscillator, FLL control circuit, the switched-capacitor resistor-divider circuit, and the SSC generator.

6. An FLL (frequency locked loop) oscillator circuit suitable for use as a clock generator, comprising
   a frequency locked loop (FLL) oscillator generating an oscillator signal FLL_clk with a frequency $f_{OSC}$ based on an oscillator control signal, the FLL_clk generated with spread spectrum modulation;
   an FLL control loop to generate the oscillator control signal based on the frequency of the FLL_clk output of the FLL oscillator, including
      a switched-capacitor resistor-divider circuit to provide a frequency control signal based on the frequency of the FLL_clk;
      a spread spectrum clocking (SSC) generator to generate a spread spectrum control signal corresponding to a spread spectrum modulation function; and
      an FLL control circuit to provide the oscillator control signal based on the frequency control signal and the spread spectrum control signal, and including:
         an amplifier circuit receiving the spread spectrum control signal from the SSC generator at a noninverting input, and the frequency control signal from the switched-capacitor resistor-divider at an inverting input, and outputting an FLL control signal corresponding to the frequency control signal with spread spectrum modulation;
         the FLL control circuit providing the oscillator control signal with spread spectrum modulation based on the FLL control signal;
   the switched-capacitor resistor-divider circuit, including:
      a resistor coupled at an R-divider node to a switched capacitor;
      the switched capacitor to convert the frequency $f_{OSC}$ of FLL_clk to a resistance;
      such that the resistor and the switched capacitor operate as resistor divider that outputs the frequency control signal at the R-divider node.

7. The circuit of claim 6, wherein the FLL oscillator comprises a ring oscillator, responsive to the oscillator control signal to adjust oscillation frequency.

8. The circuit of claim 6, wherein the FLL control circuit further comprises a current control transistor controlled by the FLL control signal, and outputting the oscillator control signal as a controlled current.

9. The circuit of claim 6:
   wherein the SSC generator comprises:
      an RC relaxation oscillator circuit, including a comparator with inverting and noninverting inputs and an output; and
      a tripping threshold setting circuit;
      the RC relaxation oscillator including
         an RC circuit characterized by an RC time constant providing a negative feedback RC transition voltage to the inverting input;
         the tripping threshold circuit providing a positive feedback tripping threshold voltage to the noninverting input, and configured to switch between a $V_{TH}$ upper tripping threshold voltage, and a $V_{TL}$ lower tripping threshold voltage, with switching controlled by the comparator output;

such that the negative feedback RC transition voltage is truncated (corresponding to the $V_{TH}$ and $V_{TL}$ tripping threshold voltages), and substantially triangular;

wherein the SSC generator outputs as the spread spectrum control signal the substantially triangular, truncated RC transition voltage.

10. The circuit of claim 6, further comprising a low dropout voltage regulator (LDO) providing a VLDO supply voltage for the FLL oscillator, FLL control circuit, the switched-capacitor resistor-divider circuit, and the SSC generator.

11. A method of generating a clock using an FLL (frequency locked loop) oscillator circuit, comprising generating an oscillator signal FLL_clk with a frequency $f_{OSC}$ based on an oscillator control signal, the FLL_clk generated with spread spectrum modulation;

generating the oscillator control signal based on a frequency control signal representative of the frequency of the FLL_clk output of the FLL oscillator;

generating the frequency control signal based on the frequency of the FLL_clk, using a switched-capacitor resistor-divider that includes a resistor and a switched capacitor coupled at an R-divider node by:

switching the switching capacitor in response the FLL_clk to convert the frequency fosc to a switched-cap resistance; and outputting the frequency control signal from the R-divider node based on voltage division provided by the resistor and the switched-cap resistance; and generating a spread spectrum control signal corresponding to a spread spectrum modulation function;

modulating the frequency control signal with the spread spectrum control signal to generate an FLL control signal with spread spectrum modulation; and generating the oscillator control signal with spread spectrum modulation based on the FLL control signal.

12. The method of claim 11, wherein the oscillator signal FLL_clk is generated by a ring oscillator, responsive to the oscillator control signal to adjust oscillation frequency.

13. The method of claim 11, wherein the spread spectrum control signal is generated with an RC relaxation oscillator including a comparator with inverting and noninverting inputs and an output, including:

providing a negative feedback RC transition voltage to the inverting input of the comparator, based on an RC circuit characterized by an RC time constant;

generating a tripping threshold voltage by switching between a $V_{TH}$ upper tripping threshold voltage, and a $V_{TL}$ lower tripping threshold voltage, with switching controlled by the comparator output;

providing the tripping threshold voltage as a positive feedback tripping threshold voltage to the noninverting input of the comparator;

such that the negative feedback RC transition voltage is truncated (corresponding to the $V_{TH}$ and $V_{TL}$ tripping threshold voltages), and substantially triangular;

generating the spread spectrum control signal based on the substantially triangular, truncated RC transition voltage.

14. The method of claim 11, further comprising providing from a low dropout voltage regulator (LDO) a VLDO supply voltage used in generating FLL_clk, the frequency control signal, the oscillator control signal, and the spread spectrum control signal.

* * * * *